United States Patent
Yongxin et al.

(10) Patent No.: US 10,482,799 B2
(45) Date of Patent: Nov. 19, 2019

(54) RIMLESS DISPLAY DEVICE AND PREPARATION METHOD THEREOF

(71) Applicants: KUNSHAN NEW FLAT PANEL DISPLAY TECHNOLOGY CENTER CO., LTD, Kunshan, Jiangsu (CN); KUNSHAN GO-VISIONOX OPTO-ELECTRONICS CO., LTD, Kunshan, Jiangsu (CN)

(72) Inventors: Cui Yongxin, Kunshan (CN); Li Suhua, Kunshan (CN); Wang Baoyou, Kunshan (CN)

(73) Assignees: Kunshan New Flat Panel Display Technology Center Co., LTD, Kunshan, Jiangsu (CN); Kunshan Go-Visionox Opto-Electronics Co., LTD, Kunshan, Jiangsu (CN)

( * ) Notice: Subject to any disclaimer, the term of this patent is extended or adjusted under 35 U.S.C. 154(b) by 0 days.

(21) Appl. No.: 15/780,442

(22) PCT Filed: Nov. 30, 2016

(86) PCT No.: PCT/CN2016/107983
§ 371 (c)(1),
(2) Date: May 31, 2018

(87) PCT Pub. No.: WO2017/101677
PCT Pub. Date: Jun. 22, 2017

(65) Prior Publication Data
US 2018/0357941 A1    Dec. 13, 2018

(30) Foreign Application Priority Data

Dec. 16, 2015 (CN) .......................... 2015 1 0945235

(51) Int. Cl.
*H01L 51/00* (2006.01)
*G09F 9/33* (2006.01)
(Continued)

(52) U.S. Cl.
CPC ................ *G09F 9/33* (2013.01); *G09F 9/301* (2013.01); *H01L 51/0097* (2013.01);
(Continued)

(58) Field of Classification Search
CPC .... G09G 2380/02; H05K 1/028; H05K 1/189; H05K 2201/10128; H01L 51/0097; G09F 9/33; G09F 9/301
See application file for complete search history.

(56) References Cited

U.S. PATENT DOCUMENTS 9,099,414 B2    8/2015  Naijo
9,214,640 B2 *  12/2015 Lee ..................... H01L 51/0097
(Continued)

FOREIGN PATENT DOCUMENTS

CN    102568377 A    7/2012
CN    203376939 U    1/2014
(Continued)

OTHER PUBLICATIONS

Issued by the China Patent Office; First Office Action of 201510945235.2; dated Oct. 31, 2018; pp. 1-9.
(Continued)

*Primary Examiner* — Dung A. Le
(74) *Attorney, Agent, or Firm* — Taft Stettinius & Hollister LLP; Stephen F. Rost

(57) ABSTRACT

A rimless display device and a preparation method thereof, the rimless display device comprises a flexible substrate formed on a rigid base plate (1), the flexible substrate is provided with a display region (2) having an organic light-emitting layer arranged therein and a non-display region (3), (Continued)

wherein, after a part of the rigid base plate at a location corresponding to the non-display region (3) is removed, the non-display region (3) of the flexible substrate is fixed on a lateral surface or a rear surface of the display device after the non-display region (3) is folded. This rimless display device can achieve a real rimless display screen body, thereby further increasing the screen proportion and greatly improving the view effect.

9 Claims, 1 Drawing Sheet

(51) Int. Cl.
    *G09F 9/30*     (2006.01)
    *H05K 1/02*     (2006.01)
    *H05K 1/18*     (2006.01)

(52) U.S. Cl.
    CPC ............. *H05K 1/028* (2013.01); *H05K 1/189* (2013.01); *G09G 2380/02* (2013.01); *H01L 2251/5338* (2013.01); *H05K 2201/10106* (2013.01); *H05K 2201/10128* (2013.01)

(56) References Cited

U.S. PATENT DOCUMENTS

| | | | | |
|---|---|---|---|---|
| 9,668,318 | B2* | 5/2017 | Choi | .................. H01L 51/0097 |
| 2009/0231816 | A1 | 9/2009 | Lin | |
| 2011/0050657 | A1 | 3/2011 | Yamada | |
| 2012/0146886 | A1 | 6/2012 | Minami et al. | |
| 2012/0218219 | A1 | 8/2012 | Rappoport et al. | |
| 2013/0076268 | A1 | 3/2013 | Choi et al. | |
| 2013/0126874 | A1 | 5/2013 | Jung et al. | |
| 2014/0002385 | A1 | 1/2014 | Ka et al. | |
| 2014/0042406 | A1 | 2/2014 | Degner et al. | |
| 2014/0183473 | A1 | 7/2014 | Lee et al. | |
| 2014/0217373 | A1* | 8/2014 | Youn | .................. H01L 23/4985 257/40 |
| 2015/0123137 | A1 | 5/2015 | Kwon et al. | |
| 2015/0173171 | A1 | 6/2015 | Kim et al. | |
| 2016/0268318 | A1 | 9/2016 | Zhou | |
| 2016/0360607 | A1 | 12/2016 | Li | |
| 2017/0301884 | A1 | 10/2017 | Li | |

FOREIGN PATENT DOCUMENTS

| | | |
|---|---|---|
| CN | 103826381 A | 5/2014 |
| CN | 104009044 A | 8/2014 |
| CN | 104464524 A | 3/2015 |
| CN | 204229775 U | 3/2015 |
| CN | 104637953 A | 5/2015 |
| CN | 104885140 A | 9/2015 |
| CN | 104992956 A | 10/2015 |
| CN | 106157821 A | 11/2016 |
| EP | 2939228 A | 11/2015 |
| JP | 201147977 A | 3/2011 |
| JP | 2014512556 A | 5/2014 |
| JP | 2015204239 A | 11/2015 |
| KR | 1020140095817 A | 8/2014 |
| TW | 201445396 A | 12/2014 |
| WO | 2014140711 A1 | 7/2014 |

OTHER PUBLICATIONS

European Search Report, European Patent Office, dated Dec. 4, 2018, pp. 1-7.
Taiwan First Office Action for 201445396; Intellectual Property of Taiwan; 6 pages.
International Search Report of the ISA/CN, International Application No. PCT/CN2016/107983; dated Mar. 8, 2017; 4 pages.
International Search Report of the ISA/KR; International Application No. PCT/KR2013/012104; dated Apr. 29, 2014: 2 pages.
First Office Action of Korea Application No. 10-2018-7016136; Korean Intellectual Property Office; dated Jun. 19, 2019; 6 pages.
First Office Action of Japanese Application No. 2018-529242, Japanese Patent Office, dated Aug. 13, 2019, 6 pages.
Decision of Rejection of Chinese Application No. 201510945235.2, dated Jul. 25, 2019, 6 pages.
Chinese Patent Office, P.R. China; Second Office Action of China Application No. 2015109452352; dated Mar. 25, 2019; pp. 1-6.

* cited by examiner

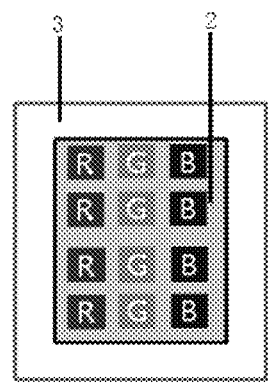 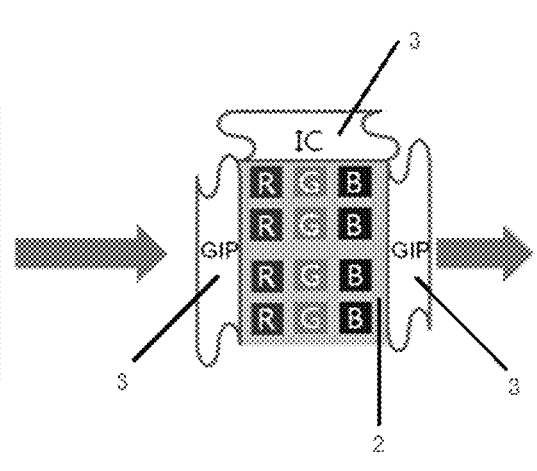 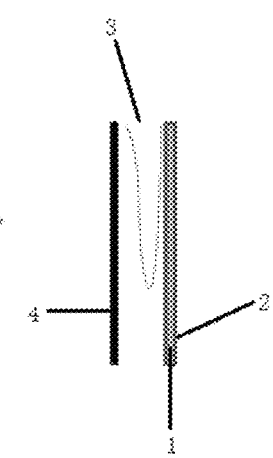
Figure 1-1  Figure 1-2  Figure 1-3
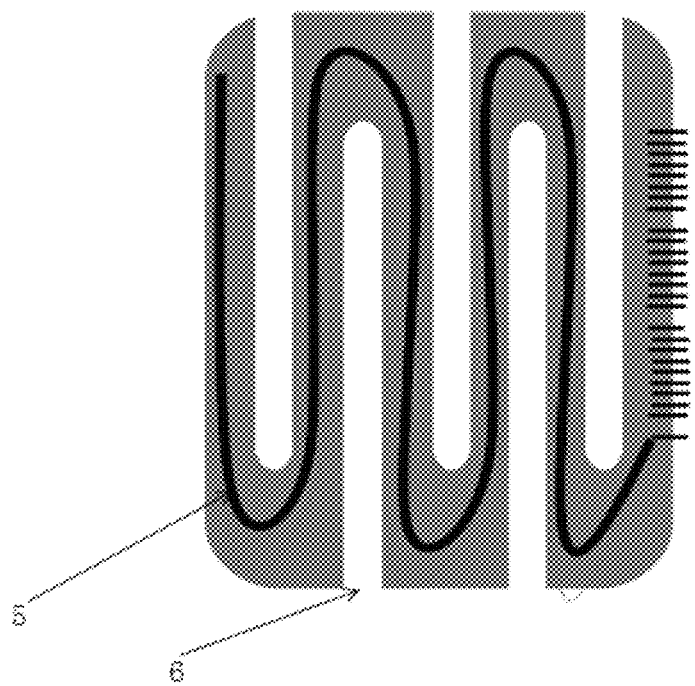
Figure 2

RIMLESS DISPLAY DEVICE AND PREPARATION METHOD THEREOF

This application is a U.S. national stage application under 35 U.S.C. § 371 of PCT International Application Serial No. PCT/CN2016/107983, which has an international filing date of Nov. 30, 2016, designates the United States of America, and claims the benefit of CN Application No. 201510945235.2, which was filed on Dec. 16, 2015, the disclosures of which are hereby expressly incorporated by reference in their entirety.

TECHNICAL FIELD

The present invention relates to the field of flat panel display technology, and in particular relates to a rimless display device and a preparation method thereof.

BACKGROUND

Along with the continuous development of display technology, OLED (Organic Light-Emitting Diode) has increasingly become an international research hotspot because of its advantages such as high brightness of light-emitting, color richness, low-voltage direct-current driving, simple preparation process. OLED has broader field of vision and thus can be made into products with larger sizes to meet users' requirements for various dimensions. It is determined by the aforementioned significant advantages that OLED will become the next-generation mainstream display technology.

The existing display screens on the market comprise a display area and a rim, but in order to make OLED display devices look compact and fashionable, OLED provided with a narrow rim has become a trend of OLED display device development. As for the OLED display panels in prior art, because a side portion of the array layer is required for electrical circuit cabling, the so-called "rimless" therein is just making the portion reserved for IC or periphery circuits as smaller as possible, which can only be regarded as an ultra-narrow rim or ultra-narrow rim display device, not a real rimless display device. For example, CN201110414415 discloses a display device, its periphery circuits and part of its cabling are folded into an arc structure, and a foldable substrate is folded at a middle portion of the cabling part, so as to form a display screen with a narrow rim.

SUMMARY OF THE INVENTION

Thus, a technical problem to be solved by the present invention is that a side portion of the array layer of OLED display panels in prior art is required for electrical circuit cabling and therefore a rimless display device cannot be manufactured. To solve this problem, the present invention provides a rimless display device that can achieve a real rimless display screen body, thereby further increasing the screen proportion and greatly improving the view effect.

In order to solve the above-mentioned technical problem, the present invention adopts the following technical scheme:

A rimless display device, comprising a flexible substrate provided with a display region having an organic light-emitting layer arranged therein and a non-display region, wherein, the non-display region of the flexible substrate is fixed on a lateral surface or a rear surface of the display device after the non-display region is folded.

The flexible substrate is placed on a rigid base plate.

The non-display region is fixed on a lateral surface or a rear surface of the display device after the non-display region is folded along a boundary between the display region and the non-display region.

The non-display region is provided with an IC zone and a GIP zone, and the GIP zone has a hollowed-out structure.

The parts of the non-display region on two neighboring sides of the display region have a disconnected structure.

The rimless display device further comprises a drive circuit board assembly arranged on a side of the rigid base plate away from the organic light-emitting layer, wherein, the drive circuit board assembly and the display region have overlapping projections on the flexible substrate.

When the rimless display device is a top-emitting display device, the non-display region is fixed on a rear surface of the drive circuit board assembly after the non-display region is folded; when the rimless display device is a bottom-emitting display device, the non-display region is fixed on a lateral surface of the drive circuit board assembly after the non-display region is folded.

A method of making a rimless display device, comprising the following steps:

S1, providing a flexible substrate on a rigid base plate, dividing the flexible substrate into a display region and a non-display region, and providing a drive circuit board assembly on one side of the rigid base plate away from the flexible substrate;

S2, preparing an organic light-emitting layer in the display region, and preparing IC and GIP in the non-display region;

S3, removing a part of the rigid base plate at a location corresponding to the non-display region, and fixing the non-display region on a lateral surface or a rear surface of the drive circuit board assembly after folding the non-display region.

When the display device is a bottom-emitting display device, the step S3 comprises: making a part of the non-display region where the GIP is located into a hollowed-out structure, removing the part of the rigid base plate at a location corresponding to the non-display region, and fixing the non-display region on a lateral surface of the drive circuit board assembly after folding the non-display region.

When the display device is a top-emitting display device, the step S3 comprises: making a part of the non-display region where the GIP is located into a hollowed-out structure, removing the part of the rigid base plate at a location corresponding to the non-display region, and fixing the non-display region on a rear surface of the drive circuit board assembly after folding the non-display region.

As compared to the prior art, the above-mentioned technical scheme of the present invention has the following advantages:

In the rimless display device provided by the present invention, a part of the rigid base plate at a location corresponding to the non-display region is removed, and then the non-display region of the flexible substrate is fixed on a lateral surface or a rear surface of the display device after being folded. Because the flexible substrate is directly folded, a real rimless display screen body can be achieved, thereby further increasing the screen proportion and greatly improving the view effect.

Furthermore, in the present invention, the non-display region is manufactured to have a hollowed-out structure, only the part of the flexible substrate in a zone adjacent to the cabling remains in this hollowed-out structure. This hollowed-out structure can effectively release bending stress and can be bent by 90° without damaging the cabling.

BRIEF DESCRIPTION OF THE DRAWINGS

In order to make the content of the present invention easier to be understood clearly, hereinafter, the present invention is further described in detail according to specific embodiments of the present invention with reference to the accompanying drawings, wherein, FIG. 1-1 to FIG. 1-3 are structural schematic diagrams showing a preparation process of a rimless display device of the present invention;

FIG. 2 is a schematic diagram showing the non-display region of the present invention, which is manufactured to have a hollowed-out structure.

The reference numerals in the Drawings represent: 1—rigid base plate, 2—display region, 3—non-display region, 4—drive circuit board assembly, 5—cabling, 6—hollowed-out structure.

DETAILED DESCRIPTION OF EMBODIMENTS

In order to make the objective, technical scheme and advantages of the present invention clearer, detailed description of embodiments of the present invention is further given below, with reference to the accompanying drawings.

The present invention can be implemented in many different forms and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is only defined by the claims. In the accompanying drawings, for the sake of clarity, dimensions and relative sizes of layers and areas might be exaggerated. It should be understood that, when one element such as a layer, an area or a substrate plate is described as "formed on" or "configured on" another element, this one element may be configured directly upon that another element, or there may exist intermediate element(s). On the contrary, when one element is described as "directly formed upon" or "directly configured upon" another element, there exist no intermediate element.

As shown in FIG. 1, a rimless display device of the present invention comprises a flexible substrate formed on a rigid base plate 1, the flexible substrate is provided with a display region 2 and a non-display region 3; an anode layer, an organic light-emitting layer and a cathode layer are arranged in the display region 2; wherein, after a part of the rigid base plate 1 at a location corresponding to the non-display region 3 is removed, the non-display region 3 of the flexible substrate is fixed on a lateral surface or a rear surface of the display device after being folded. The organic light-emitting layer comprises a hole injection layer and/or a hole transport layer, a light-emitting layer, an electron transport layer and/or an electron injection layer.

The non-display region 3 is fixed on a lateral surface or a rear surface of the display device after being folded along a boundary between the display region 2 and the non-display region 3. The non-display region 3 has a hollowed-out structure 6 as shown in FIG. 2, wherein only the part of the flexible substrate in a zone adjacent to the cabling 5 remains in this hollowed-out structure 6. By making the gate driving circuit (abbreviated as GIP) into a hollowed-out structure, bending stress can be effectively released, and this hollowed-out structure can be bended by 90° without damaging the cabling.

The parts of the non-display region 3 on two neighboring sides of the display region 2 have a disconnected structure. Specifically, as shown in FIG. 1-2, the part of the non-display region where the gate driving circuit (GIP) is located is disconnected from the part of the non-display region where the Integrated Circuit (abbreviated as IC) is located.

Such a disconnected structure allows the part of the non-display region where the gate driving circuit (GIP) is located and the part of the non-display region where the Integrated Circuit (IC) is located to be individually fixed on a lateral surface or a rear surface of the display device after being respectively folded along the boundary.

As shown in FIG. 1-3, the rimless display device of the present invention further comprises a drive circuit board assembly 4 arranged on a side of the rigid base plate away from the organic light-emitting layer, wherein the drive circuit board assembly 4 and the display region 2 have overlapping projections on the flexible substrate.

When the rimless display device is a top-emitting display device, the non-display region 3 is fixed on a rear surface of the drive circuit board assembly 4 after being folded. As shown in FIG. 1-3, the rear surface of the drive circuit board assembly 4 herein refers to the inside surface of the drive circuit board assembly 4 facing the rigid base plate. Because it is a top-emitting display device, fixing the folded non-display region 3 on the rear surface of the drive circuit board assembly 4 would not cause obstruction to the light emitted from the display region 2.

When the rimless display device is a bottom-emitting display device, the non-display region 3 is fixed on a lateral surface of the drive circuit board assembly 4 after being folded. The lateral surface of the drive circuit board assembly 4 herein refers to a periphery surface of the drive circuit board assembly 4 outside the projection range of the display region 2. For a bottom-emitting display device, fixing the folded non-display region 3 on a periphery surface of the drive circuit board assembly 4 outside the projection range of the display region 2, with the drive circuit board assembly 4 itself being transparent, can avoid causing obstruction to the light emitted from the display region 2.

There is provided a preparation method of the rimless display device, which comprises the following steps:

S1, providing a flexible substrate on a rigid base plate 1, dividing the flexible substrate into a display region 2 and a non-display region 3;

S2, preparing an organic light-emitting layer in the display region 2, and preparing IC and gate driving circuit (GIP) in the non-display region 3;

S3, removing a part of the rigid base plate at a location corresponding to the non-display region 3, and fixing the non-display region 3 on a lateral surface or a rear surface of the rigid base plate after folding the non-display region 3.

When the display device is a bottom-emitting display device, the step S3 comprises: making a part of the non-display region where the GIP is located into a hollowed-out structure 6, removing the part of the rigid base plate at a location corresponding to the non-display region 3, and fixing the non-display region 3 on a lateral surface of the drive circuit board assembly 4 after folding the non-display region 3. As explained above, for a bottom-emitting display device, fixing the folded non-display region 3 on a periphery surface of the drive circuit board assembly 4 outside the projection range of the display region 2, with the drive circuit board assembly 4 itself being transparent, can avoid causing obstruction to the light emitted from the display region 2.

When the display device is a top-emitting display device, the step S3 comprises: making a part of the non-display region where the GIP is located into a hollowed-out structure 6, removing the part of the rigid base plate at a location corresponding to the non-display region 3, and fixing the non-display region 3 on a rear surface of the drive circuit board assembly 4 after folding the non-display region 3. As explained above, because it is a top-emitting display device, fixing the folded non-display region 3 on the rear surface of the drive circuit board assembly 4 would not cause obstruction to the light emitted from the display region 2.

In the rimless display device provided by the present invention, a part of the rigid base plate at a location corresponding to the non-display region is removed, and then the non-display region of the flexible substrate is fixed on a lateral surface or a rear surface of the display device after being folded. Because the flexible substrate is directly folded, a real rimless display screen body can be achieved, thereby further increasing the screen proportion and greatly improving the view effect.

In the absence of a special statement, the materials adopted by the respective layers of the device in the present invention are as follows:

The anode layer can adopt an inorganic material or an organic conducting polymer. The inorganic material is usually a metal oxide such as indium tin oxide (ITO), zinc oxide (ZnO), indium zinc oxide (IZO), or a metal with high work function such as gold, copper, silver, preferably, it is ITO. The organic conducting polymer is preferably selected from Polythiophene/Polyethylene based sodium benzene sulfonate (hereinafter abbreviated as PEDOT:PSS) and Polyaniline (hereinafter abbreviated as PANI).

The cathode layer usually adopts metal with low work function such as silver, lithium, magnesium, calcium, strontium, aluminum, indium; or their alloy with copper, gold, silver; or an electrode layer formed by alternately arranged metal and metal fluoride. In the present invention, the cathode layer is preferably an Al layer.

The material of the hole transport layer may adopt a low molecular material selected from the aryl-amine type, the carbazole type or the branched polymer species, preferably NPB and TCTA.

The material of the hole injection layer may adopt HAT-CN (2,3,6,7,10,11-hexacyano-1,4,5,8,9,12-hexa-aza-benzene) doped with F4TCNQ, or may adopt copper peptide cyanine (CuPc), or may adopt a metal oxide such as molybdenum oxide, rhenium oxide.

The light-emitting material in the light-emitting layer may adopt a fluorescent dye selected from the coumarin type such as DMQA or C545T, the bis-pyran type such as DCJTB or DCM; or may contain a metal complex of Ir, Pt, Os, Ru, Rh, Pd, lanthanides or actinides.

The doping concentration of a fluorescent dye in the light-emitting layer is no higher than 5 wt %, the doping concentration of a phosphorescent dye in the light-emitting layer is no higher than 30 wt %. Said doping concentration=dye mass/(dye mass+host material mass)× 100%.

The host material in the light-emitting layer may be selected from an ordinary matrix material, such as 4,4'-di-(carbazole-9-yl)-biphenyl (CBP).

The material of the electron transport layer of the present invention may be selected from an ordinary electron transport layer material, such as aromatic condensed ring compounds (e.g., Pentacene, Perylene) or o-phenanthrolines (e.g., Bphen, BCP).

The flexible substrate may adopt polyester, polyimide compound material, or may be a thin metal sheet. The laminating and encapsulation thereof may adopt any suitable method know to a person skilled in the art.

Apparently, the aforementioned embodiments are merely examples illustrated for clearly describing the present invention, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. A rimless display device, comprising
    a flexible substrate, provided with a display region having an organic light-emitting layer arranged therein and a non-display region;
    wherein the non-display region of the flexible substrate is fixed on a lateral surface or a rear surface of the display device after the non-display region is folded,
    wherein the non-display region is provided with an integrated circuit zone and a gate driving circuit zone, and the gate driving circuit zone has a hollowed-out structure.

2. The rimless display device according to claim 1, wherein the flexible substrate is placed on a rigid base plate.

3. The rimless display device according to claim 1, wherein the non-display region is fixed on a lateral surface or a rear surface of the display device after the non-display region is folded along a boundary between the display region and the non-display region.

4. The rimless display device according to claim 1, wherein the parts of the non-display region on two neighboring sides of the display region have a disconnected structure.

5. The rimless display device according to claim 4, further comprising a drive circuit board assembly arranged on a side of the rigid base plate away from the organic light-emitting layer, wherein, the drive circuit board assembly and the display region have overlapping projections on the flexible substrate.

6. The rimless display device according to claim 5, wherein when the rimless display device is a top-emitting display device, the non-display region is fixed on a rear surface of the drive circuit board assembly after the non-display region is folded; when the rimless display device is a bottom-emitting display device, the non-display region is fixed on a lateral surface of the drive circuit board assembly after the non-display region is folded.

7. A method of making a rimless display device, comprising the following steps:
    (1) providing a flexible substrate on a rigid base plate, the flexible substrate having a display region and a non-display region, and providing a drive circuit board assembly on one side of the rigid base plate away from the flexible substrate;
    (2) preparing an organic light-emitting layer in the display region, and preparing integrated circuit and gate driving circuit in the non-display region, and making a part of the non-display region where the gate driving circuit is located into a hollowed-out structure;
    (3) removing a part of the rigid base plate at a location corresponding to the non-display region, and fixing the non-display region on a lateral surface or a rear surface of the drive circuit board assembly after folding the non-display region.

8. The method of making a rimless display device according to claim 7, wherein when the display device is a bottom-emitting display device, the step (3) comprises:
    removing the part of the rigid base plate at a location corresponding to the non-display region, and fixing the non-display region on a lateral surface of the drive circuit board assembly after folding the non-display region.

9. The method of making a rimless display device according to claim 7, wherein when the display device is a top-emitting display device, the step (3) comprises:
removing the part of the rigid base plate at a location corresponding to the non-display region, and fixing the non-display region on a rear surface of the drive circuit board assembly after folding the non-display region.

* * * * *